United States Patent
Hayashi et al.

(10) Patent No.: US 9,419,204 B2
(45) Date of Patent: *Aug. 16, 2016

(54) PIEZOELECTRIC MATERIAL

(75) Inventors: Jumpei Hayashi, Yokohama (JP); Tatsuo Furuta, Machida (JP); Yasushi Shimizu, Fujisawa (JP); Takanori Matsuda, Chofu (JP); Hiroshi Saito, Kawasaki (JP); Makoto Kubota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 152 days.

This patent is subject to a terminal disclaimer.

(21) Appl. No.: 14/130,477

(22) PCT Filed: Jun. 26, 2012

(86) PCT No.: PCT/JP2012/066835
§ 371 (c)(1),
(2), (4) Date: Dec. 31, 2013

(87) PCT Pub. No.: WO2013/005700
PCT Pub. Date: Jan. 10, 2013

(65) Prior Publication Data
US 2014/0145106 A1 May 29, 2014

(30) Foreign Application Priority Data
Jul. 5, 2011 (JP) ................. 2011-149360

(51) Int. Cl.
*H01L 41/187* (2006.01)
*C04B 35/468* (2006.01)
(Continued)

(52) U.S. Cl.
CPC ........ *H01L 41/1871* (2013.01); *C04B 35/4682* (2013.01); *C04B 35/49* (2013.01);
(Continued)

(58) Field of Classification Search
CPC . C09K 35/49; C09K 35/4682; H01L 41/1871
See application file for complete search history.

(56) References Cited

U.S. PATENT DOCUMENTS

| 4,755,493 A | 7/1988 | Takeuchi |
| 2010/0029464 A1 | 2/2010 | Shibasaki et al. |

(Continued)

FOREIGN PATENT DOCUMENTS

| CN | 100371252 C | 2/2008 |
| CN | 101238080 A | 8/2008 |

(Continued)

OTHER PUBLICATIONS

Daisuke Tanaka et al.; "High Power Characteristics of (Ca,Ba)TiO3 Piezoelectric Ceramics With High Mechanical Quality Factor;" Japanese Journal of Applied Physics; vol. 49, 2010, pp. from 09MD03-1 to 09MD03-4.

(Continued)

*Primary Examiner* — Carol M Koslow
(74) *Attorney, Agent, or Firm* — Canon U.S.A., Inc., IP Division

(57) ABSTRACT

A lead-free piezoelectric material that does not undergo depolarization in a wide operating temperature range and has a good piezoelectric constant is provided. A piezoelectric material include a perovskite-type metal oxide represented by $(Ba_{1-x}Ca_x)_a(Ti_{1-y}Zr_y)O_3$ (where $1.00 \leq a \leq 1.01$, $0.125 \leq x \leq 0.175$, and $0.055 \leq y \leq 0.090$) as a main component, and manganese incorporated in the perovskite-type metal oxide. The manganese content relative to 100 parts by weight of the perovskite-type metal oxide is 0.02 parts by weight or more and 0.10 parts by weight or less on a metal basis.

4 Claims, 1 Drawing Sheet

(51) Int. Cl.
*C04B 35/49* (2006.01)
*C04B 35/626* (2006.01)

(52) U.S. Cl.
CPC ... *C04B35/62685* (2013.01); *C04B 2235/3208* (2013.01); *C04B 2235/3215* (2013.01); *C04B 2235/3225* (2013.01); *C04B 2235/3236* (2013.01); *C04B 2235/3239* (2013.01); *C04B 2235/3244* (2013.01); *C04B 2235/3248* (2013.01); *C04B 2235/3262* (2013.01); *C04B 2235/449* (2013.01); *C04B 2235/5445* (2013.01); *C04B 2235/72* (2013.01); *C04B 2235/77* (2013.01); *C04B 2235/786* (2013.01); *C04B 2235/79* (2013.01)

(56) References Cited

U.S. PATENT DOCUMENTS

2014/0117811 A1   5/2014   Hayashi
2014/0131611 A1   5/2014   Hayashi

FOREIGN PATENT DOCUMENTS

| CN | 101260000 | A | 9/2008 |
|---|---|---|---|
| CN | 101935212 | A | 1/2011 |
| EP | 2328193 | * | 6/2011 |
| EP | 2328193 | A2 | 6/2011 |
| JP | 2000-082796 | A | 3/2000 |
| JP | 2004238251 | A | 8/2004 |
| JP | 2009-215111 | A | 9/2009 |
| JP | 2010120835 | A | 6/2010 |
| JP | 2011032111 | A | 2/2011 |
| RU | 2305669 | C1 | 9/2007 |
| WO | 2012/070667 | A1 | 5/2012 |
| WO | 2012/093646 | A1 | 7/2012 |

OTHER PUBLICATIONS

U.S. Appl. No. 14/130,671, filed Jan. 2, 2104, Jumpei Hayashi.

U.S. Appl. No. 14/130,670, filed Jan. 2, 2104, Jumpei Hayashi.

Dezhen Xue et al.; "Elastic, Piezoecletric, Dielectric Properties of Ba(Z40.2Ti0.8_O3-50 (Ba0.7Ca0.3)TiO3 Pb-Free Ceramic at the Morphotropic Phase Boundary;" Journal of Applied Physics, vol. 109, 2011, pp. from 054110-1 to 054110-6.

Li, et al., "Piezoelectric and Dielectric Properties of (Ba1-xCax)(Ti0.95Zr0,05)O3 Lead-Free Ceramics", J. Am. Ceram. Soc. vol. 93, No. 10, pp. 2942-2944, 2010.

* cited by examiner

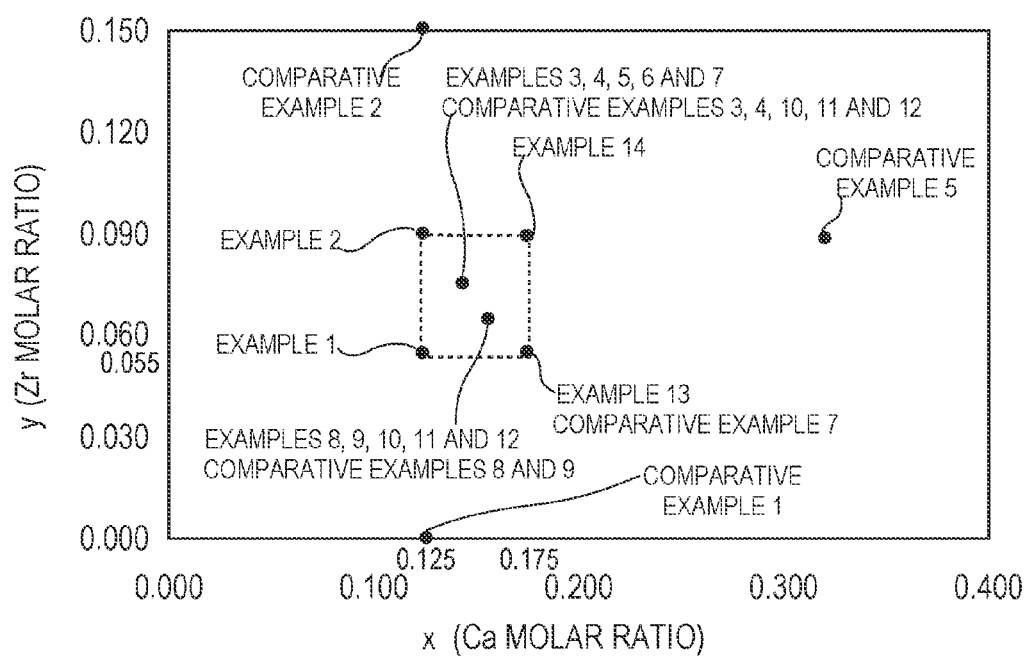

PIEZOELECTRIC MATERIAL

TECHNICAL FIELD

The present invention generally relates to piezoelectric materials and, in particular, to a lead-free piezoelectric material.

BACKGROUND ART $ABO_3$ perovskite-type metal oxides such as lead zirconate titanate (referred to as "PZT" hereinafter) are typically used as piezoelectric materials. Since PZT contains lead as the A site element, a concern has been raised over PZT's impact on the environment. Thus, lead-free piezoelectric materials that use perovskite-type metal oxides are highly desirable.

An example of a lead-free piezoelectric material that contains a perovskite-type metal oxide is barium titanate. Studies on and development of barium-titanate-based materials have been conducted to improve properties of barium titanate. PTL 1 and NPL 1 each disclose a material having a piezoelectric property improved by substituting some of A sites of barium titanate with Ca and some of B sites with Zr. However, such a material has a low Curie temperature of 80° C. or less and undergoes depolarization in a severe environment such as car compartments under summer sun, possibly leading to loss of piezoelectricity.

CITATION LIST

Patent Literature

PTL 1 Japanese Patent Laid-Open No. 2009-215111

Non Patent Literature

NPL 1 "Journal of Applied Physics" vol. 109 2011, from 054110-1 to 054110-6

SUMMARY OF INVENTION

Technical Problem

The present invention provides a lead-free piezoelectric material that does not undergo depolarization in an operating temperature range and exhibits an excellent piezoelectric constant.

Solution to Problem

An aspect of the invention provides a piezoelectric material that includes a perovskite-type metal oxide represented by general formula (1) as a main component, and manganese incorporated in the perovskite-type metal oxide:

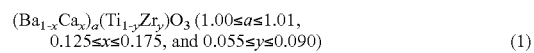

$(Ba_{1-x}Ca_x)_a(Ti_{1-y}Zr_y)O_3$ ($1.00 \leq a \leq 1.01$, $0.125 \leq x \leq 0.175$, and $0.055 \leq y \leq 0.090$)  (1)

The manganese content relative to 100 parts by weight of the perovskite-type metal oxide is 0.02 parts by weight or more and 0.10 parts by weight or less on a metal basis.

Advantageous Effects of Invention

The present invention provides a lead-free piezoelectric material that does not undergo depolarization in a wide operating temperature range and has an excellent piezoelectric constant.

BRIEF DESCRIPTION OF DRAWINGS

FIG. 1 is a graph showing the relationship between x and y of piezoelectric materials of Examples 1 to 14 and Comparative Examples 1 to 12.

DESCRIPTION OF EMBODIMENT

An embodiment of the invention will now be described.

A piezoelectric material according to an embodiment of the invention includes a perovskite-type metal oxide represented by general formula (1) as a main component, and manganese incorporated in the perovskite-type metal oxide

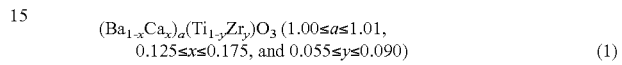

$(Ba_{1-x}Ca_x)_a(Ti_{1-y}Zr_y)O_3$ ($1.00 \leq a \leq 1.01$, $0.125 \leq x \leq 0.175$, and $0.055 \leq y \leq 0.090$)  (1)

The manganese content relative to 100 parts by weight of the perovskite-type metal oxide is 0.02 parts by weight or more and 0.10 parts by weight or less on a metal basis.

In this description, a perovskite-type metal oxide refers to a metal oxide having a perovskite-type structure which is ideally a cubic crystal structure as described in Iwanami Rikagaku Jiten, 5th edition (published Feb. 20, 1998 by Iwanami Shoten Publishers). A metal oxide having a perovskite-type structure is usually expressed by a chemical formula, $ABO_3$. Element A and element B in a perovskite-type metal oxide take form of ions and occupy particular positions in a unit cell called A sites and B sites, respectively. For example, in a unit cell of a cubic crystal system, element A occupies vertexes of the cube and element B occupies the body-centered position of the cube. Element O is oxygen in the form of an anion and occupies face-centered positions of the cube.

In the metal oxide represented by general formula (1) above, barium (Ba) and calcium (Ca) are metal elements that occupy A sites and titanium (Ti) and zirconium (Zr) are metal elements that occupy B sites. Note that some of the Ba and Ca atoms may occupy B sites and/or some of the Ti and Zr atoms may occupy A sites.

In general formula (1), the molar ratio of the B-site element to O is 1:3. A metal oxide having a B-site element/O ratio slightly deviated therefrom, e.g., 1.00:2.94 to 1.00:3.06, is still included in the scope of the present invention as long as the metal oxide has a perovskite-type structure as a main phase.

Structural analysis through X-ray diffraction or electron beam diffraction can be used to determine whether a metal oxide has a perovskite-type structure, for example.

The piezoelectric material may take any form, for example, a ceramic, powder, single crystal, film, slurry, or the like but is preferably a ceramic. In this description, a "ceramic" refers to an aggregate (also referred to as bulk) of crystal grains basically composed of a metal oxide and consolidated by heat treatment, and is a polycrystal. A "ceramic" may also refer to a ceramic that has been processed after sintering.

In general formula (1) above, a represents the ratio of the total molar amount of Ba and Ca in A sites to the total molar amount of Ti and Zr in B sites and is in a range of $1.00 \leq a \leq 1.01$. When a is smaller than 1.00, abnormal grain growth readily occurs and the mechanical strength of the material is decreased. When a is greater than 1.01, the temperature needed for grain growth becomes excessively high and sintering cannot be achieved in a common firing furnace. Here, "sintering cannot be achieved" refers to a state in which the density is not sufficiently increased or a large number of pores and defects are present in the piezoelectric material. More preferably, $1.000 \leq a \leq 1.005$.

In general formula (1), x represents the molar ratio of Ca in A sites and is in a range of $0.125 \leq x \leq 0.175$. When x is less than 0.125, the dielectric loss (tan δ) increases, thereby possibly adversely affecting the operation durability. In contrast, when x is larger than 0.175, the piezoelectric property becomes insufficient. Preferably, $0.140 \leq x \leq 0.175$. A dielectric loss is a constant indicating the degree of electrical energy loss that occurs when an AC field is applied to a piezoelectric material. A dielectric loss can be evaluated by using an LCR meter or an impedance analyzer.

In general formula (1), y indicating the molar ratio of Zr in B sites is in a range of $0.055 \leq y \leq 0.090$. When y is smaller than 0.055, the piezoelectric property becomes insufficient. In contrast, when y is larger than 0.090, the Curie temperature ($T_c$) becomes as low as less than 85° C. and the piezoelectric property will be lost at a high temperature. Preferably, $0.055 \leq x \leq 0.075$.

In this description, a Curie temperature refers to a temperature at which ferroelectricity is lost. Examples of the method for detecting the temperature include a method of directly measuring the temperature at which ferroelectricity is lost by varying the measurement temperature and a method of measuring the dielectric constant using minute AC fields while varying the measurement temperature and determining the temperature at which the dielectric constant is maximal.

The method for determining the composition of the piezoelectric material is not particularly limited. Examples of the method include X-ray fluorescence analysis, inductively coupled plasma (ICP) atomic emission spectroscopy, and atomic absorption spectrometry. The weight ratios and compositional ratios of the elements contained in the piezoelectric material can be determined by any of these methods.

The Mn content in the piezoelectric material is 0.02 parts by weight or more and 0.10 parts by weight or less on a metal basis relative to 100 parts by weight of the metal oxide. At a Mn content in this range, the piezoelectric material exhibits improved insulating property and dielectric loss. The improvements in the insulating property and dielectric loss are presumably attributable to introduction of defect dipoles due to Mn having a valence different from that of Ti and Zr and generation of internal electric fields resulting therefrom. When an internal electric field is present, a piezoelectric element formed by using the piezoelectric material and operated by applying voltage exhibits long-term reliability.

The term "on a metal basis" with reference to the Mn content refers to a value determined by first determining the oxide-based amounts of elements constituting the metal oxide represented by general formula (1) based on the Ba, Ca, Ti, Zr, and Mn contents measured by XRF, ICP atomic emission spectroscopy, atomic absorption spectroscopy, or the like and then calculating the ratio of the weight of Mn relative to 100 parts by weight of the total amount of the elements constituting the metal oxide on a weight basis. When the Mn content is less than 0.02 parts by weight, the effect of the polarization treatment needed to yield the piezoelectric property may become insufficient and the dielectric loss may increase. In contrast, when the Mn content is more than 0.10 parts by weight, the piezoelectric property may become insufficient.

Manganese is not limited to metallic Mn and may take any form as long as manganese is contained as a component in the piezoelectric material. For example, manganese may be dissolved in B sites or may be included in grain boundaries. Manganese may take the form of a metal, ion, oxide, metal salt, or complex in the piezoelectric material. Preferably, manganese is dissolved in B sites from the viewpoints of insulating property and sinterability. When manganese is dissolved in B sites, a preferable range of the molar ratio A/B is $0.996 \leq A/B \leq 0.999$, where A is the molar amount of Ba and Ca in A sites and B is the molar amount of Ti, Zr, and Mn in B sites. A piezoelectric material having A/B within this range exhibits a high piezoelectric constant and a low dielectric loss. Thus, a device having high durability can be fabricated by using such a piezoelectric material.

The piezoelectric material may contain components (hereinafter referred to as auxiliary components) other than the compound represented by general formula (1) and Mn as long as the properties are not changed. The total content of the auxiliary components may be 1.2 parts by weight or less relative to 100 parts by weight of the metal oxide represented by general formula (1). When the auxiliary component content exceeds 1.2 parts by weight, the piezoelectric property and the insulating property of the piezoelectric material may be degraded. The content of the metal elements other than Ba, Ca, Ti, Zr, and Mn among the auxiliary components is preferably 1.0 parts by weight or less on an oxide basis or 0.9 parts by weight or less on a metal basis relative to the piezoelectric material. In this description, "metal elements" include semimetal elements such as Si, Ge, and Sb. When the content of the metal elements other than Ba, Ca, Ti, Zr, and Mn among the auxiliary components exceeds 1.0 parts by weight on an oxide basis or 0.9 parts by weight on a metal basis relative to the piezoelectric material, the piezoelectric property and the insulating property of the piezoelectric material may be significantly degraded. The total content of Li, Na, Mg, and Al among the auxiliary components may be 0.5 parts by weight or less on a metal basis relative to the piezoelectric material. When the total content of Li, Na, Mg, and Al among the auxiliary components exceeds 0.5 parts by weight on a metal basis relative to the piezoelectric material, insufficient sintering may occur. The total of Y and V among the auxiliary components may be 0.2 parts by weight or less on a metal basis relative to the piezoelectric material. When the total content of Y and V exceeds 0.2 parts by weight on a metal basis relative to the piezoelectric material, the polarization treatment may become difficult.

Examples of the auxiliary components include sintering aids such as Si and Cu. Commercially available Ba and Ca raw materials contain Sr as an unavoidable impurity and thus the piezoelectric material may contain an impurity amount of Sr. Similarly, a commercially available Ti raw material contains Nb as an unavoidable impurity and a commercially available Zr raw material contains Hf as an unavoidable impurity. Thus, the piezoelectric material may contain impurity amounts of Nb and Hf.

The method for measuring the weights of the auxiliary components is not particularly limited. Examples of the method include X-ray fluorescence analysis, ICP atomic emission spectroscopy, and atomic absorption spectrometry.

The Ca/Zr (x/y) molar ratio b of the piezoelectric material may be in a range of $1.4 \leq b \leq 3.0$. When b is less than 1.4, Mn does not sufficiently dissolve and the dielectric loss may increase. In contrast, when b is greater than 3.0, the ratios of the c axis and the a axis of a unit cell increase and the piezoelectric property may decrease. More preferably, $1.87 \leq b \leq 3.00$.

The piezoelectric material of this embodiment may be constituted by crystal grains having an average circular equivalent diameter of 1 μm or more and 10 μm or less. When the average circular equivalent diameter is within this range, the piezoelectric material can exhibit good piezoelectric property and mechanical strength. When the average circular equivalent diameter is less than 1 μm, the piezoelectric property may become insufficient. When the average circular equivalent diameter is more than 10 μm, the mechanical strength may decrease. A more preferable range is 3 μm or more and 8 μm or less.

In this description, a "circular equivalent diameter" refers to what is generally known as a "projected area diameter" in microscopy and indicates the diameter of a circle having the same area as the projected area of a crystal grain. In this invention, the method for measuring the circular equivalent diameter is not particularly limited. For example, an image of a surface of a piezoelectric material may be obtained with a polarizing microscope or a scanning electron microscope and the image may be processed to determine the circular equivalent diameter. Since the optimum magnification differs depending on the grain diameter to be analyzed, an optical microscope and an electron microscope may be properly used. The circular equivalent diameter may be determined from an image of a polished surface or a cross section instead of a surface of the material.

The relative density of the piezoelectric material may be 93% or more and 100% or less. When the relative density is less than 93%, the piezoelectric property and/or the dielectric loss may not be satisfactory and the mechanical strength may be degraded.

The method for producing the piezoelectric material of this embodiment is not particularly limited.

The piezoelectric material may be processed into a piezoelectric ceramic by a common method of sintering a mixture of solid powders containing constitutional elements, such as oxides, carbonate salts, nitrate salts, and oxalate salts, at an atmospheric pressure. Examples of the raw materials are metal compounds such as Ba compounds, Ca compounds, Ti compounds, Zr compounds, and Mn compounds.

Examples of the Ba compound that can be used include barium oxide, barium carbonate, barium oxalate, barium acetate, barium nitrate, barium titanate, barium zirconate, and barium zirconate titanate.

Examples of the Ca compound that can be used include calcium oxide, calcium carbonate, calcium oxalate, calcium acetate, calcium titanate, and calcium zirconate.

Examples of the Ti compound that can be used include titanium oxide, barium titanate, barium zirconate titanate, and calcium titanate.

Examples of the Zr compound that can be used include zirconium oxide, barium zirconate, barium zirconate titanate, and calcium zirconate.

Examples of the Mn compound that can be used include manganese carbonate, manganese oxide, manganese dioxide, manganese acetate, and trimanganese tetraoxide.

The raw materials for adjusting the molar ratio a, i.e., the molar amount of Ba and Ca in A sites to the molar amount of Ti and Zr in B sites of the piezoelectric ceramic are not particularly limited. The same effect can be achieved from a Ba compound, a Ca compound, a Ti compound, and a Zr compound.

The method for granulating raw material powders of the piezoelectric ceramic is not particularly limited. From the viewpoint of uniformity of particle diameter of the resulting granules, a spray dry method may be employed.

Examples of the binder used in granulation include polyvinyl alcohol (PVA), polyvinyl butyral (PVB), and acrylic resins. The amount of binder added is preferably 1 to 10 parts by weight and more preferably 2 to 5 parts by weight from the viewpoint of increasing the density of a compact.

The method for sintering the piezoelectric ceramic is not particularly limited. Sintering may be conducted with an electric furnace or a gas furnace or by an electric heating method, a microwave sintering method, a millimeter wave sintering method, or hot isostatic pressing (HIP). Sintering using an electric furnace or gas may be conducted in a continuous furnace or a batch furnace.

The sintering temperature of the ceramic in the sintering method described above is not particularly limited. The sintering temperature may be a temperature that allows the compounds to react and undergo sufficient crystal growth. The sintering temperature is preferably 1200° C. or more and 1550° C. or less and more preferably 1300° or more and 1480° C. or less from the viewpoint of making the grain diameter of the ceramic to be within the range of 1 μm to 10 μm. A piezoelectric ceramic sintered within this temperature range exhibits a good piezoelectric property.

In order to stabilize the properties of the piezoelectric ceramic obtained by sintering while achieving high reproducibility, the sintering temperature may be kept constant within the above described range and sintering may be conducted for 2 to 24 hours. A two-step sintering method may be employed but rapid temperature changes are not desirable from the viewpoint of productivity.

The piezoelectric ceramic may be heat-treated at a temperature of 1000° C. or higher after being polished. When a piezoelectric ceramic is mechanically polished, a residual stress occurs inside the piezoelectric ceramic. This residual stress can be relaxed by heat-treating at 1000° C. or higher and the piezoelectric property of the piezoelectric ceramic can be further improved. The heat treatment also has an effect of eliminating raw material powders, such as barium carbonate, precipitated in grain boundary portions. The amount of time for the heat treatment is not particularly limited but may be 1 hour or longer.

The piezoelectric property of the piezoelectric material of this embodiment can be evaluated by forming a piezoelectric element having a first electrode and a second electrode. Each of the first and second electrodes is constituted by an electrically conductive layer having a thickness of about 5 nm to about 2000 nm. The material used to form the electrodes may be any material commonly used in piezoelectric elements. Examples thereof include metals such as Ti, Pt, Ta, Ir, Sr, In, Sn, Au, Al, Fe, Cr, Ni, Pd, Ag, and Cu and compounds thereof.

The first and second electrodes may each be composed of one of these materials or may be constituted by a multilayer structure prepared by stacking two or more of these materials. The first and second electrodes may be composed of materials different from each other.

The method for making the first and second electrodes may be any. For example, the electrodes may be formed by baking a metal paste, by sputtering, or by vapor deposition. The first and second electrode may be patterned as desired.

The piezoelectric element may have polarization axes oriented in a particular direction. When polarization axes are oriented in a particular direction, the piezoelectric constant of the piezoelectric element is increased. The polarization method for the piezoelectric element is not particularly limited. The polarization treatment may be conducted in air or in silicone oil. The temperature during polarization may be 60° C. to 100° C. but optimum conditions slightly vary depending on the composition of the piezoelectric ceramic constituting the device. The electric field applied to conduct the polarization treatment may be 800 V/mm to 2.0 kV/mm.

The piezoelectric constant of the piezoelectric element can be calculated from a resonant frequency and an antiresonant frequency measured with a commercially available impedance analyzer on the basis of Electronic Materials Manufacturers Association of Japan Standard (EMAS-6100). This method is hereinafter referred to as a resonance-antiresonance method.

The piezoelectric material of this embodiment is suitable for use in displacement-type actuators (soft devices) that operate at non-resonance frequencies, such as optical pickup actuators and liquid discharge heads.

EXAMPLES

The present invention will now be described in further detail by way of examples below which do not limit the scope of the present invention.

Piezoelectric ceramics were prepared as follows.

Example 1

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio was 87.5:7.0:5.5 on a molar basis. In order to adjust the molar ratio a of Ba and Ca in A sites to Ti and Zr in B sites, 0.005 mol of barium oxalate was added. The resulting mixture was dry-mixed in a ball mill for 24 hours. To the resulting mixture, 0.06 parts by weight of manganese(II) acetate on a manganese metal basis and 3 parts by weight of a PVA binder relative to the mixed powder were caused to adhere to surfaces of the mixed powder by using a spray dryer in order to granulate the mixed powder.

The granulated powder was charged in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1420° C. was retained for 5 hours.

The average circular equivalent diameter and relative density of the crystal grains constituting the resultant ceramic were evaluated. The average circular equivalent diameter was 7.7 μm and the relative density was 94.9%. A polarizing microscope was mainly used to observe crystal grains. The diameter of small crystal grains was determined by using a scanning electron microscope (SEM). The average circular equivalent diameter was calculated on the basis of the observation results. The relative density was evaluated by the Archimedean method.

The ceramic was polished to a thickness of 0.5 mm and the crystal structure of the ceramic was analyzed by X-ray diffraction. As a result, only peaks attributable to a perovskite-type structure were observed.

The composition was analyzed through X-ray fluorescence analysis. The results found that 0.06 parts by weight of Mn was incorporated in a composition expressed by a chemical formula, $(Ba_{0.875}Ca_{0.125})_{1.000}(Ti_{0.945}Zr_{0.055})O_3$. This means that the composition prepared by weighing matches the composition after sintering. The contents of the elements other than Ba, Ca, Ti, Zr, and Mn were below detection limits, i.e., less than 0.1 parts by weight.

The crystal grains were observed again. However, the average circular equivalent diameter was not much different between before and after polishing.

Examples 2 to 14

Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed so that the ratio on a molar basis was as shown in Table 1. In order to adjust the molar ratio a of Ba and Ca in A sites to Ti and Zr in B sites, barium oxalate in an amount indicated in Table 1 was added. These powders were dry-mixed in a ball mill for 24 hours. To the resulting mixture, manganese(II) acetate in an amount on a manganese metal basis shown in Table 1 and 3 parts by weight of a PVA binder relative to the mixed powder were caused to adhere to surfaces of the mixed powder by using a spray dryer in order to granulate the mixed powder.

The granulated powder was charged in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1350° C. to 1480° C. was retained for 5 hours. The maximum temperature was increased as the amount of Ca was increased.

The average circular equivalent diameter and the relative density of crystal grains constituting the resulting ceramic were evaluated. The results are shown in Table 2. A polarizing microscope was mainly used to observe crystal grains. The diameter of small crystal grains was determined by using a scanning electron microscope (SEM). The average circular equivalent diameter was calculated on the basis of the observation results. The relative density was evaluated by the Archimedean method.

The ceramic was polished to a thickness of 0.5 mm and the crystal structure of the ceramic was analyzed by X-ray diffraction. As a result, only peaks attributable to a perovskite-type structure were observed in all samples.

The composition was analyzed by X-ray fluorescence analysis. The results are shown in Table 3. In the table, auxiliary components refer to elements other than Ba, Ca, Ti Zr, and Mn and 0 means that the content was below the detection limit. As a result, it was found that the composition prepared by weighing matched the composition after sintering in all samples.

The crystal grains were observed again. However, the size and conditions of the crystal grains were not much different between after sintering and after polishing.

Comparative Examples 1 to 12

The same raw material powders as those in Examples 1 to 14 and barium zirconate having an average particle diameter of 300 nm (produced by Nippon Chemical Industrial Co., Ltd.) produced by a solid phase method were weighed so that the molar ratio was as shown in Table 1. Each mixture was dry-mixed in a ball mill for 24 hours. In Comparative Example 7, Y and V in a total amount of 2.1 parts by weight on an oxide basis were added as auxiliary components. To the resulting mixture, manganese(II) acetate in an amount on a manganese metal basis indicated in Table 1 and 3 parts by weight of a PVA binder relative to the mixed powder were caused to adhere to surfaces of mixed powder by using a spray dryer in order to granulate the mixed powder.

A ceramic was prepared under the same conditions as in Examples 1 to 14 by using the resulting granulated powder. The average circular equivalent diameter and the relative density of crystal grains constituting the ceramic were evaluated. The results are shown in Table 2. Evaluation of the crystal grains and the relative density was conducted as in Examples 1 to 14.

Each resulting ceramic was polished to a thickness of 0.5 mm and the crystal structure of the ceramic was analyzed by X-ray diffraction. As a result, only peaks attributable to a perovskite-type structure were observed in all samples.

The composition was analyzed by X-ray fluorescence analysis. The results are shown in Table 3. As a result, it was found that the composition prepared by weighing matched the composition after sintering in all samples.

The relationship between x and y in the piezoelectric materials of Examples 1 to 14 and Comparative Examples 1 to 12 is shown in the graph of FIG. 1. In the figure, the range marked by a broken line indicates the range of x and y of general formula (1) representing the perovskite-type metal oxide described in the embodiment.

TABLE 1

| | $BaTiO_3$ [mol] | $CaTiO_3$ [mol] | $CaZrO_3$ [mol] | $BaZrO_3$ [mol] | $BaC_2O_4$ [mol] | Mn [parts by weight] | Auxiliary components [parts by weight] |
|---|---|---|---|---|---|---|---|
| Example 1 | 87.5 | 7.0 | 5.5 | 0.0 | 0.005 | 0.06 | 0.0 |
| Example 2 | 87.5 | 3.5 | 9.0 | 0.0 | 0.005 | 0.06 | 0.0 |
| Example 3 | 86.0 | 6.5 | 7.5 | 0.0 | 0.006 | 0.02 | 0.0 |
| Example 4 | 86.0 | 6.5 | 7.5 | 0.0 | 0.003 | 0.02 | 0.0 |
| Example 5 | 86.0 | 6.5 | 7.5 | 0.0 | 0.008 | 0.07 | 0.0 |
| Example 6 | 86.0 | 6.5 | 7.5 | 0.0 | 0.005 | 0.07 | 0.0 |
| Example 7 | 86.0 | 6.5 | 7.5 | 0.0 | 0.007 | 0.08 | 0.0 |
| Example 8 | 84.5 | 9.0 | 6.5 | 0.0 | 0.003 | 0.02 | 0.0 |
| Example 9 | 84.5 | 9.0 | 6.5 | 0.0 | 0.006 | 0.06 | 0.0 |
| Example 10 | 84.5 | 9.0 | 6.5 | 0.0 | 0.009 | 0.06 | 0.0 |
| Example 11 | 84.5 | 9.0 | 6.5 | 0.0 | 0.008 | 0.10 | 0.0 |
| Example 12 | 84.5 | 9.0 | 6.5 | 0.0 | 0.012 | 0.10 | 1.0 |
| Example 13 | 82.5 | 12.0 | 5.5 | 0.0 | 0.009 | 0.06 | 0.0 |
| Example 14 | 82.5 | 8.5 | 9.0 | 0.0 | 0.014 | 0.10 | 0.0 |
| Comparative Example 1 | 87.5 | 12.5 | 0.0 | 0.0 | 0.009 | 0.08 | 0.0 |
| Comparative Example 2 | 72.5 | 12.5 | 0.0 | 15.0 | 0.005 | 0.06 | 0.0 |
| Comparative Example 3 | 86.0 | 6.5 | 7.5 | 0.0 | 0.005 | 0.00 | 0.0 |
| Comparative Example 4 | 86.0 | 6.5 | 7.5 | 0.0 | 0.031 | 0.45 | 0.0 |
| Comparative Example 5 | 68.0 | 23.0 | 9.0 | 0.0 | 0.014 | 0.10 | 0.0 |
| Comparative Example 6 | 94.5 | 0.0 | 0.0 | 5.5 | 0.004 | 0.06 | 0.0 |
| Comparative Example 7 | 82.5 | 12.0 | 5.5 | 0.0 | 0.009 | 0.06 | 2.1 |
| Comparative Example 8 | 84.5 | 9.0 | 6.5 | 0.0 | 0.002 | 0.06 | 0.0 |
| Comparative Example 9 | 84.5 | 9.0 | 6.5 | 0.0 | 0.035 | 0.06 | 0.0 |
| Comparative Example 10 | 86.0 | 6.5 | 7.5 | 0.0 | 0.008 | 0.07 | 0.0 |
| Comparative Example 11 | 86.0 | 6.5 | 7.5 | 0.0 | 0.008 | 0.07 | 0.0 |
| Comparative Example 12 | 86.0 | 6.5 | 7.5 | 0.0 | 0.008 | 0.07 | 0.0 |

TABLE 2

| | Average circular equivalent diameter [μm] | Relative density [%] |
|---|---|---|
| Example 1 | 7.7 | 94.9 |
| Example 2 | 6.5 | 95.3 |
| Example 3 | 7.8 | 91.8 |
| Example 4 | 7.1 | 94.5 |
| Example 5 | 8.6 | 95.1 |
| Example 6 | 6.9 | 95.3 |
| Example 7 | 6.1 | 94.7 |
| Example 8 | 6.7 | 92.7 |
| Example 9 | 6.8 | 93.8 |
| Example 10 | 9.6 | 93.9 |
| Example 11 | 5.5 | 94.7 |
| Example 12 | 10.8 | 93.8 |
| Example 13 | 4.3 | 94.4 |
| Example 14 | 7.1 | 94.3 |
| Comparative Example 1 | 2.1 | 93.7 |
| Comparative Example 2 | 7.9 | 93.6 |
| Comparative Example 3 | 7.9 | 93.0 |
| Comparative Example 4 | 1.4 | 93.1 |
| Comparative Example 5 | 0.8 | 93.2 |
| Comparative Example 6 | 7.6 | 95.1 |
| Comparative Example 7 | 4.5 | 94.1 |
| Comparative Example 8 | 124.0 | 93.8 |
| Comparative Example 9 | 0.5 | 93.7 |
| Comparative Example 10 | 0.8 | 94.0 |
| Comparative Example 11 | 112.0 | 96.5 |
| Comparative Example 12 | 8.6 | lower than 93% |

TABLE 3

|  | x | y | a | Mn [parts by weight] | Auxiliary components [parts by weight] | b |
|---|---|---|---|---|---|---|
| Example 1 | 0.125 | 0.055 | 1.000 | 0.06 | 0.0 | 2.27 |
| Example 2 | 0.125 | 0.090 | 1.000 | 0.06 | 0.0 | 1.39 |
| Example 3 | 0.140 | 0.075 | 1.003 | 0.02 | 0.0 | 1.87 |
| Example 4 | 0.140 | 0.075 | 1.000 | 0.02 | 0.0 | 1.87 |
| Example 5 | 0.140 | 0.075 | 1.003 | 0.07 | 0.0 | 1.87 |
| Example 6 | 0.140 | 0.075 | 1.000 | 0.07 | 0.0 | 1.87 |
| Example 7 | 0.140 | 0.075 | 1.001 | 0.08 | 0.0 | 1.87 |
| Example 8 | 0.155 | 0.065 | 1.000 | 0.02 | 0.0 | 2.38 |
| Example 9 | 0.155 | 0.065 | 1.001 | 0.06 | 0.0 | 2.38 |
| Example 10 | 0.155 | 0.065 | 1.004 | 0.06 | 0.0 | 2.38 |
| Example 11 | 0.155 | 0.065 | 1.001 | 0.10 | 0.0 | 2.38 |
| Example 12 | 0.155 | 0.065 | 1.005 | 0.10 | 1.0 | 2.38 |
| Example 13 | 0.175 | 0.055 | 1.004 | 0.06 | 0.0 | 3.18 |
| Example 14 | 0.175 | 0.090 | 1.007 | 0.10 | 0.0 | 1.94 |
| Comparative Example 1 | 0.125 | 0.000 | 1.003 | 0.08 | 0.0 | — |
| Comparative Example 2 | 0.125 | 0.150 | 1.000 | 0.06 | 0.0 | 0.83 |
| Comparative Example 3 | 0.140 | 0.075 | 1.003 | 0.00 | 0.0 | 1.87 |
| Comparative Example 4 | 0.140 | 0.075 | 1.010 | 0.45 | 0.0 | 1.87 |
| Comparative Example 5 | 0.320 | 0.090 | 1.007 | 0.10 | 0.0 | 3.56 |
| Comparative Example 6 | 0.000 | 0.055 | 1.000 | 0.06 | 0.0 | 0.00 |
| Comparative Example 7 | 0.175 | 0.055 | 1.004 | 0.06 | 2.1 | 3.18 |
| Comparative Example 8 | 0.155 | 0.065 | 0.997 | 0.06 | 0.0 | 2.38 |
| Comparative Example 9 | 0.155 | 0.065 | 1.030 | 0.06 | 0.0 | 2.38 |
| Comparative Example 10 | 0.140 | 0.075 | 1.003 | 0.07 | 0.0 | 1.87 |
| Comparative Example 11 | 0.140 | 0.075 | 1.003 | 0.07 | 0.0 | 1.87 |
| Comparative Example 12 | 0.140 | 0.075 | 1.003 | 0.07 | 0.0 | 1.87 |

TABLE 4

|  | Curie temperature [° C.] | Piezoelectric constant $|d_{31}|$ [pC/N] | Dielectric loss [%] | (Ba + Ca)/(Ti + Zr + Mn) |
|---|---|---|---|---|
| Example 1 | 112 | 104 | 0.3 | 0.998 |
| Example 2 | 88 | 120 | 0.3 | 0.998 |
| Example 3 | 100 | 106 | 0.4 | 1.002 |
| Example 4 | 100 | 111 | 0.3 | 0.999 |
| Example 5 | 100 | 100 | 0.3 | 1.000 |
| Example 6 | 100 | 107 | 0.2 | 0.997 |
| Example 7 | 100 | 100 | 0.3 | 0.998 |
| Example 8 | 107 | 111 | 0.4 | 0.999 |
| Example 9 | 106 | 100 | 0.3 | 0.999 |
| Example 10 | 106 | 91 | 0.3 | 1.002 |
| Example 11 | 106 | 90 | 0.2 | 0.997 |
| Example 12 | 106 | 84 | 0.3 | 1.001 |
| Example 13 | 112 | 84 | 0.3 | 1.002 |
| Example 14 | 88 | 116 | 0.3 | 1.003 |
| Comparative Example 1 | 130 | 41 | 0.4 | 1.000 |
| Comparative Example 2 | 60 | 140 | 0.4 | 0.998 |
| Comparative Example 3 | 95 | 130 | 1.1 | 1.003 |
| Comparative Example 4 | 100 | 31 | 0.1 | 0.992 |
| Comparative Example 5 | 88 | 25 | 0.3 | 1.003 |
| Comparative Example 6 | 112 | 101 | 0.9 | 0.997 |
| Comparative Example 7 | 112 | 26 | 0.2 | 1.002 |
| Comparative Example 8 | 106 | X | X | 0.995 |
| Comparative Example 9 | 106 | 33 | 0.9 | 1.028 |
| Comparative Example 10 | 100 | 40 | 1.1 | 1.000 |
| Comparative Example 11 | 100 | X | X | 1.000 |
| Comparative Example 12 | 100 | 35 | 0.8 | 1.000 |

Preparation of Piezoelectric Element and Evaluation of Static Characteristics

Examples 1 to 14

Piezoelectric elements were prepared as follows by using ceramics of Examples 1 to 14.

A gold electrode having a thickness of 400 nm was formed on both sides of the disk-shaped ceramic described above by DC sputtering. A titanium film functioning as an adhesive layer and having a thickness of 30 nm was formed between the electrode and the ceramic. The ceramic with the electrodes was cut into a strip-shaped piezoelectric element 10 mm×2.5 mm×0.5 mm in size.

The piezoelectric element was placed on a hot plate having a surface adjusted to 60° C. to 100° C. and a 1 kV/mm electric field was applied to the piezoelectric element for 30 minutes to conduct a polarization treatment.

The static characteristics, i.e., the Curie temperature, the dielectric loss, and the piezoelectric constant $d_{31}$, of the polarized piezoelectric elements that include piezoelectric materials of Examples and Comparative Examples were evaluated. The results are shown in Table 4. The Curie temperature was determined from the temperature at which the dielectric constant measured by using a minute AC field having a frequency of 1 kHz while varying the temperature was maximal. The dielectric loss was measures simultaneously with the Curie temperature. The piezoelectric constant $d_{31}$ was determined by a resonance-antiresonance method and the absolute values are indicated in the table.

The ratio of the total amount of Ba and Ca to the total amount of Ti, Zr, and Mn is also indicated in Table 4. In the table, "X" indicates that evaluation could not be conducted.

Comparison was made between Examples 3 and 4, between Examples 5 and 6, between Examples 9 and 10, and between Examples 11 and 12. In each combination, x, y, and the Mn content were the same. However, Examples 4, 6, 9, and 11 in which a was small exhibited superior piezoelectric constants and dielectric loss. In Examples 4, 6, 9, and 11, the ratio of the total amount of Ba and Ca to the total amount of Ti, Zr, and Mn was 0.996 or more and 0.999 or less.

Similar characteristics were observed in all Examples when the gold electrodes were replaced by electrodes prepared by baking a silver paste.

Comparative Examples 1 to 12

Piezoelectric elements were prepared by using ceramics of Comparative Examples 1 to 12. Preparation and evaluation of the devices were conducted as in Examples 1 to 14.

In Comparative Example 1 in which Zr was not added, the piezoelectric constant $d_{31}$ was low, i.e., 41 [pC/N]. In Comparative Example 2 in which the Zr content was as high as 15% (y=0.150), the Curie temperature was low, i.e., 60° C., and the temperature range in which the piezoelectric element is operable was narrow. In Comparative Example 3 in which Mn is not contained, the dielectric loss was high. In Comparative Example 4 in which the Mn content was as high as 0.45 parts by weight, the piezoelectric constant was small. In Comparative Example 5 in which the Ca content was as high as 32% (x=0.32), sintering did not proceed sufficiently and grain growth was insufficient, resulting in a low piezoelectric constant. In Comparative Example 6 in which Ca was not contained, the dielectric loss was high. In Comparative Example 7 in which a total of 2.1 parts by weight of Y and V were contained as auxiliary components, the piezoelectric constant $d_{31}$ was low, i.e., 26 [pC/N]. In Comparative Example 8, a was small, i.e., 0.997, and abnormal grain growth, i.e., growth of grains larger than 100 µm, occurred and the static characteristics other than the Curie temperature could not be evaluated. The average circular equivalent diameter of crystal grains constituting the piezoelectric material of Comparative Example 8 was significantly large relative to the thickness (0.5 mm=500 μm) of the strip-shaped piezoelectric element, and thus the piezoelectric material cleaved easily and did not have a mechanical strength sufficient for use in a device. In Comparative Example 9, a was as large as 1.030. Thus, sintering did not proceed sufficiently, grain growth was insufficient, and the piezoelectric constant $d_{31}$ was low, i.e., 33 [pC/N]. In Comparative Example 10, the average circular equivalent diameter of the grains was less than 1 μm and the piezoelectric constant was low. In Comparative Example 11, abnormal grain growth of grains growing to 100 μm or larger in terms of average circular equivalent diameter was observed and thus the static characteristics other than the Curie temperature could not be evaluated due to the same reason as the piezoelectric material of Comparative Example 8. In Comparative Example 12, the relative density was lower than 93% and thus the piezoelectric constant was low.

Evaluation of Dynamic Characteristics of Piezoelectric Element

Dynamic characteristics of the piezoelectric elements that include piezoelectric materials corresponding to those of Examples and Comparative Examples were evaluated as below. The dynamic characteristics measured were the rate of change in piezoelectric constant when voltage was applied under the conditions described below.

Dynamic characteristics of the piezoelectric elements of Examples 1 to 14 and Comparative Examples 2, 3, and 6 in which the piezoelectric constant $d_{31}$ was high and the static characteristics were relatively good among the piezoelectric materials of Comparative Examples were evaluated. A piezoelectric constant $d_{31}$ after applying a 100 V AC voltage having a frequency of 110 kHz sufficiently far from the resonance frequency of the strip-shaped piezoelectric element for 100 hours was evaluated. The rate of change in piezoelectric constant between before and after voltage application is summarized in Table 5.

TABLE 5

| | Piezoelectric constant $|d_{31}|$ before voltage application [pC/N] | Piezoelectric constant $|d_{31}|$ after voltage application [pC/N] | Rate of change |
|---|---|---|---|
| Example 1 | 104 | 99 | −4.8% |
| Example 2 | 120 | 115 | −4.2% |
| Example 3 | 106 | 102 | −3.8% |
| Example 4 | 111 | 107 | −3.6% |
| Example 5 | 100 | 96 | −4.0% |
| Example 6 | 107 | 102 | −4.7% |
| Example 7 | 100 | 97 | −3.0% |
| Example 8 | 111 | 106 | −4.5% |
| Example 9 | 100 | 95 | −5.0% |
| Example 10 | 91 | 87 | −4.4% |
| Example 11 | 90 | 87 | −3.3% |
| Example 12 | 84 | 81 | −3.6% |
| Example 13 | 84 | 81 | −3.6% |
| Example 14 | 116 | 111 | −4.3% |
| Comparative Example 2 | 140 | 41 | −70.7% |
| Comparative Example 3 | 130 | 114 | −12.3% |
| Comparative Example 6 | 101 | 89 | −11.9% |

The rate of change in piezoelectric property was 5% or less in all samples of Examples whereas the rate of change was 10% or more in all samples of Comparative Examples. The cause for this in Comparative Examples 3 and 6 is probably that the dielectric loss was high and thus the electric loss during voltage application was also high. In Comparative Example 2, a low Curie temperature of 60° C. probably caused depolarization as heat is generated from the device under voltage application. In other words, a device does not exhibit sufficient operation durability unless the Curie temperature is 85° C. or more and the dielectric loss is 0.4% or less.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-149360, filed Jul. 5, 2011, which is hereby incorporated by reference herein in its entirety.

INDUSTRIAL APPLICABILITY

A piezoelectric material of the invention does not undergo depolarization in a wide operating temperature range and offers a lead-free piezoelectric material having good piezoelectric constant. Thus, the piezoelectric material is environmentally low impact and can be used in appliances, such as liquid discharge heads, that use large number of piezoelectric elements containing piezoelectric materials.

The invention claimed is:

1. A piezoelectric material comprising:
a perovskite-type metal oxide represented by general formula (1) as a main component $(Ba_{1-x}Ca_x)_a(Ti_{1-y}Zr_y)O_3$ (where $1.00 \leq a \leq 1.01$, $0.125 \leq x \leq 0.175$, and $0.055 \leq y \leq 0.090$)     (1);

and
a manganese component,
wherein a manganese content relative to 100 parts by weight of the perovskite-type metal oxide is 0.02 parts by weight or more and 0.10 parts by weight or less on a metal basis,
wherein an auxiliary component content other than manganese relative to 100 parts by weight of the perovskite-type metal oxide is less than 1.2 parts by weight on an oxide basis,
wherein the piezoelectric material is constituted by crystal grains having an average circular equivalent diameter of more than 1.0 μm and less than 10.8 μm, and
wherein the piezoelectric material has a relative density of 91.8% or more and 100% or less.

2. The piezoelectric material according to claim 1, wherein a molar ratio b of Ca to Zr in the piezoelectric material is $1.4 \leq b \leq 3.0$.

3. The piezoelectric material according to claim 1, wherein $0.140 \leq x \leq 0.175$.

4. The piezoelectric material according to claim 1, wherein $0.055 \leq y \leq 0.075$.

* * * * *